United States Patent [19]

Utsugi

[11] Patent Number: 5,747,930
[45] Date of Patent: May 5, 1998

[54] ORGANIC THIN FILM ELECTROLUMINESCENT DEVICE

[75] Inventor: Koji Utsugi, Tokyo, Japan

[73] Assignee: NEC Corporation, Tokyo, Japan

[21] Appl. No.: 443,174

[22] Filed: May 17, 1995

[30] Foreign Application Priority Data

May 17, 1994 [JP] Japan .................................. 6-101468

[51] Int. Cl.$^6$ ................................................ H05B 33/00
[52] U.S. Cl. ........................ 313/504; 315/169.3; 428/917
[58] Field of Search .............................. 313/504, 503, 313/512, 352, 355; 315/169.3; 428/917, 690

[56] References Cited

U.S. PATENT DOCUMENTS

| | | | |
|---|---|---|---|
| 4,885,211 | 12/1989 | Tang et al. | 428/457 |
| 5,059,861 | 10/1991 | Littman et al. | 313/504 |
| 5,458,977 | 10/1995 | Hosokawa et al. | 313/504 |
| 5,516,577 | 5/1996 | Matsuura et al. | 313/504 |

FOREIGN PATENT DOCUMENTS

| | | |
|---|---|---|
| 0 468 439 | 1/1992 | European Pat. Off. . |
| 4-19993 | 1/1992 | Japan . |
| 4-230997 | 8/1992 | Japan . |
| 4-363895 | 12/1992 | Japan . |
| 5-121172 | 5/1993 | Japan . |
| 5275175 | 10/1993 | Japan . |

OTHER PUBLICATIONS

Murayama et al., "Organic EL devices doped with a quinacridone derivative showing higher brightness and luminescent efficiency", Extended abstracts of the 54th Autumn Meeting (1993) The Japan Society of Applied Physics; No. 3 p. 1127.

C.W. Tang et al., "Organic Electroluminescent Diodes", Appl. Phys. Lett. 51 (12), Sep. 21, 1987, pp. 913 to 915.

H. Ishida et al., "First-Principles Study of the Covrge Dependence of the Elec Structure of Alkali–Metal–Metal . . . ", The American Phy. Soc., vol. 38, No. 8, Sep. 15, 1988, pp. 5752–5755.

H.B. Michaelson, "Relation Between An Atomic Electronegativity Scale and the Work Function", IBM, Journal of Research, vol. 22, No. 1, 1978, pp. 72–80.

Primary Examiner—Sandra L. O'Shea
Assistant Examiner—Matthew J. Esserman
Attorney, Agent, or Firm—Foley & Lardner

[57] ABSTRACT

A cathode is formed of an alloy, which includes 0.01 to 5 mol % of scandium and 0.01 to 0.3 mol % of alkali metal. Base of the alloy has a work function greater than or equal to 4 eV and is silver, aluminum, or indium or the alloy thereof. Thickness of the cathode is preferably 1 to 30 nm. Also, as a cathode protection layer, an aluminum alloy is formed on the cathode in a thickness greater than or equal to 50 nm, the aluminum alloy containing 0.1 to 5 mol % of silicon, copper, scandium and/or manganese.

7 Claims, 8 Drawing Sheets

ORGANIC THIN FILM ELECTROLUMINESCENT DEVICE

BACKGROUND OF THE INVENTION

1. Field of the Invention

The present invention relates to a cathode of an organic thin film electroluminescent (EL) device, in which organic thin film EL elements or light emitting pixels are arranged in a matrix fashion.

2. Description of the Related Art

Even since organic thin film EL diode has been reported (Tang and VanSlyke: Applied Physics Letters 51 (12) 21, pp 913 to 915, September 1987), light emitting element made of organic material have been attracting attention for abundance of applicable material and capability of obtaining an inexpensive large area color display device by synthesizing technology at a molecular level. Therefore, various studies have been made for light emitting characteristics.

The organic thin film EL device utilizes a light-emitting phenomenon via re-coupling of a hole injected through an anode and an electron injected through a cathode within a light emitting layer and emitting a light via an excited state. Accordingly, various element constructions of an organic thin film layer have been studied depending upon a property of alight emitting material of light emitting layers. However, basically, the diode can be completed by sandwiching an organic light emitting layer emitting strong luminescence by an anode and a cathode.

Furthermore, for high efficiency and stable driving of light emission, it is effective to provide a hole injection layer, a hole transporting layer, an electron injection layer and an electron transporting layer, or to dope a guest molecule in an organic light emitting layer. Also, in order to effectively inject an electron and a hole into the organic light emitting layer, study for material of an electrode, particularly for material of a cathode electrode, has progressed.

In order to facilitate injection of charge to the light emitting layer, it is desirable to use a metal for the cathode having a work function as low as possible. At this point, magnesium alloy as reported in Tang et al. is effective. Magnesium has low adhesion with the organic thin film, and difficulty may be caused in uniformly forming a magnesium layer on the organic thin film. However, this difficulty can be resolved by adding a fine amount of silver by a co-deposition method, by which the electrode can be formed uniformly in comparison with the case where magnesium is solely used. If the amount of silver to be added is too small, no effect can be expected. On the other hand, addition of an excessive amount of the silver is not desirable for increasing of the work function. Therefore, normally about 10 mol % of silver is added to magnesium.

Also, an alloy cathode, in which lithium is contained in aluminum, has higher charge injection characteristics in comparison with the magnesium-silver alloy, and is further superior to the latter in light emitting efficiency and luminance (Japanese Unexamined Patent Publication (Kokai) No. Heisei 5-121172). In a system, where a quinacridone derivative was doped in the light emitting layer and aluminum-lithium alloy was used for the cathode, over 100,000 candela per 1 m$^2$ of luminance and over 10 lumens per 1 Watt(W) of visibility could be achieved (Extended Abstracts of The 54th Autumn Meeting (1993); The Japan Society of Applied Physics; No. 3, page 1127). This is superior to other light emitting devices, such as an inorganic EL device, plasma display, and so forth. However, the above-mentioned performance was obtained in direct current drive.

A fine matrix display utilizing an organic thin film EL element without degrading high performance properties, and a driving method thereof are discussed in (Japanese Unexamined application No. Heisei 5-253866 (published as publication No. 77-111341). According to the this application, a drive circuit including a novel current controlling thin film transistor (hereinafter referred to as "TFT") has been applied to the organic thin film EL diode. As a result, lowering of luminance associated with increasing of a duty ratio of a drive pulse which has been a problem in a simple matrix type organic EL device, can be suppressed. Namely, even when the number of pixel is increased, the organic thin film EL diode can be driven without causing lowering of luminance.

In order to illuminate the organic thin film EL diode at high luminance and high efficiency for display purpose, research and development for the organic thin film EL diode has been performed in a wide field from improvement of the element including materials to improvement of the driving method.

As set forth, the organic thin film EL diode and the matrix type organic thin film EL device achieves high luminance and high light emitting efficiency which has never been achieved by other light emitting devices. However, when the diode is driven at a constant voltage, it becomes difficult to flow a current, so that light emitting efficiency is lowered as time elapsed. Also, when the diode is driven at a constant current, this causes an increase in voltage and a decrease in efficiency. This is caused due to lowering of adhesion an interface between the organic thin film and the cathode as time elapses so as to be easily peeled off, and development of an energy barrier at the interface due to oxidation and electrochemical reaction. Lowering of adhesion at the interface and growth of the energy barrier are mainly caused depending upon the material forming the cathode.

A material for the cathode of the organic thin film EL diode has to be a metal or alloy having a low work function, such as magnesium, for achieving satisfactorily high light emitting efficiency. However, such metal or alloy having a low work function generally has low adhesion to organic material. The adhesion of the cathode is low to the extent that the electrode may be easily peeled off from the organic thin film layer or the TFT in a peel test employing a cellophane bonding tape. In this circumstance, it is quite difficult to obtain a reliable element.

Figure 3:
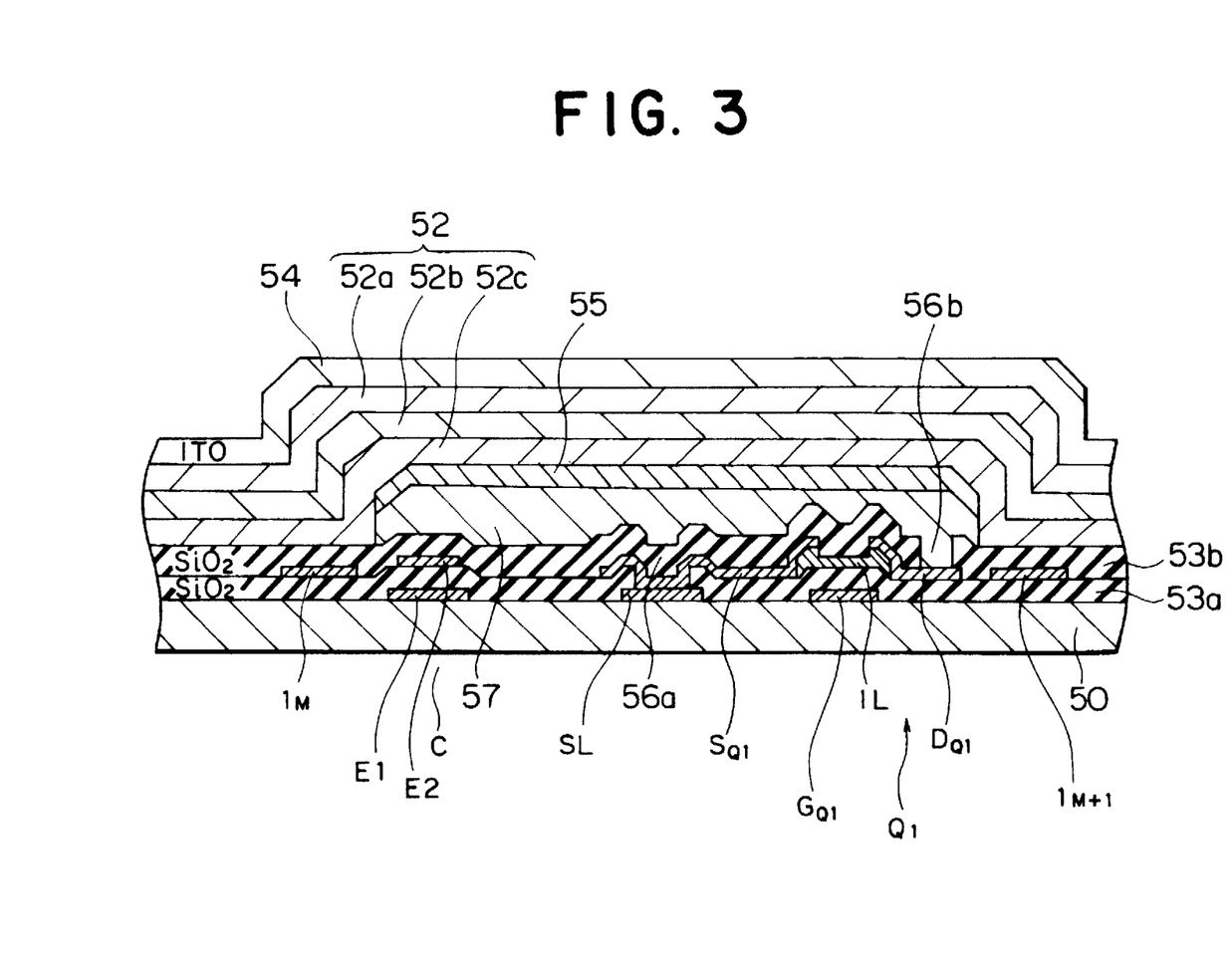
FIG. 3 is a section taken along line 3—3 of FIG. 2 of an pixel forming the matrix type organic thin film EL device to be employed in the Example 7 of the present invention.

The cathode is important in adhesion in the interface with the organic thin film EL diode and in control of energy barrier at the interface. Also, the cathode is important in realizing a matrix type organic thin film EL device driven by the TFT. In the TFT drive matrix type organic thin film EL device, the cathode is formed above the TFT. It should be noted that FIG. 3 shows a section of the pixel forming the matrix type organic thin film in the Example 7 of the present invention. The structure will be discussed later. The cathode is formed above the TFT. Therefore, when the cathode of light weight and brittle alloy, such as magnesium-silver alloy, aluminum-lithium alloy and so forth, is deposited on the TFT, breakage of the cathode at the step may be caused due to unevenness of the TFT. As a result, non-light emitting portions, namely defects, were caused in 20% of the overall pixels in a case of the cathode of the magnesium-silver alloy and in 15% of the overall pixels in a case of the cathode of aluminum-lithium alloy. Also, upon patterning of the cathode, since a cathode made of such alloy contains the metal which is mild and easy to cause corrosion, such as magnesium, lithium and so forth on the surface of cathode, corrosion, fine scratch or unevenness may be caused on the surface by etching. This serves to lower light emitting efficiency of the TFT drive matrix type organic thin film EL device, accelerate fatigue, or to be a cause of irregular light emission.

Accordingly, it is quite important in putting the organic thin film EL diode and the TFT drive matrix type organic thin film EL device into practice, to provide cathode and cathode protection layer having stability of carrier injection characteristics and high physical stability in the process. However, as far as the conventional cathode and cathode protection layer is used, it is unsatisfactory. Therefore, development of the organic thin film EL diode has been strongly demanded.

SUMMARY OF THE INVENTION

It is an object of the present invention to provide an organic thin film EL diode having a novel cathode and cathode protection layer for improving driving stability and physical stability in fabrication process with effectively achieving low power consumption, in the organic thin film EL diode and the matrix type organic EL device.

In order to solve such task, the inventors have made a research for an alkali metal containing alloy, which has a low work function, superior in adhesion with an organic thin film and can increase stability and strength of an alloy. As a result, the inventors have found that a metal or alloy, such as silver, aluminum, indium or their alloy, which contains alkali metal and scandium, is superior in physical stability.

An organic thin film electroluminescent element according to the present invention comprises: an anode; a cathode formed of a metal or alloy containing 0.01 to 5 mol % of scandium and 0.01 to 0.3 mol % of alkali metal; and an organic thin film layer disposed between the anode and cathode and having at least one light emitting layer.

Further preferably, it is desirable that the cathode is formed of a material selected from a group consisting of silver, aluminum indium and an alloy thereof. Also, it is preferred that the thickness of the cathode is in a range of 1 to 30 nm, and a cathode protection layer in a thickness of 50 to 3000 nm is formed on said cathode. The cathode protection layer is preferably formed of an aluminum alloy containing at least one element selected from a group consisting of scandium, silicon, manganese and copper, in a content of 0.1 to 5 mol % in total.

Content of Scandium

The content of scandium to be contained in the cathode is 0.01 to 5 mol %. When scandium is less than 0.01 mol %, essential improvement of the element characteristics cannot be expected. Also, when the content of scandium is too small, adhesion between the organic thin film layer and TFT becomes low to cause a problem of peeling. Furthermore, for preventing lowering of work function of the cathode, sufficient effect in charge injection cannot be expected. Increasing of concentration of alkali metal for improving charge injection characteristics with sufficiently lowering the work function, inherently causes acceleration of fatigue due to driving of the element and lowering of physical stability in the fabrication process thereof. On the other hand, when scandium exceeds 5 mol %, complete solid solution cannot be obtained to cause difficulty in obtaining uniform composition. Therefore, scandium to be contained in the cathode must be contained in a range of 0.01 to 5 mol %.

Content of Alkali Metal

Alkali metal to be contained in the cathode is 0.01 to 0.3 mol %. Alkali metal is effective to lower the work function of the cathode and to improve adhesion of the organic thin film layer. According to the report of Ishida et al.(American Physical Society, Physical Review B: Vol. 38, No. 8, September 1988: pp 5752 to 5755), in theory, when alkali metal is added to the metal, such as aluminum, addition of 25 mol % is most effective in lowering of the work function. For example, an alloy, in which 25 mol % of sodium is added to aluminum, may lower the work function is 2.2 eV. When large amount of alkali metal is added to the cathode of the organic thin film EL diode, it is effective to lower the work function. However, alkali metal has high corrosion speed and may cause acceleration of fatigue of the diode. Also, when high electric field is applied to the organic thin film, such as organic thin film EL diode, alkali metal of the cathode is considered to migrate to the organic thin film layer. As a result, lowering of light emission efficiency of the organic thin film layer in the vicinity of the cathode may be caused. This becomes more significant at greater additive amount of the alkali metal. Accordingly, alkali metal to be contained in the cathode interfacing with the organic thin film layer has to be limited in the appropriate amount.

As a result of extensive study of the inventors, it has been found that when alkali metal is added to the metal containing scandium, the work function can be lowered even when the additive amount of alkali metal is small in the extent of 0.01 to 0.3 mol %. In scandium containing metal, the work function becomes minimum at 0.3 mol % of addition of alkali metal. The reason why the work function can be sufficiently lowered even in small additive amount of alkali metal, is that an electron condition within the metal is varied by the presence of the scandium and effectively act in lowering of the work function. When alkali metal is less than 0.01 mol %, it was no effective in varying work function.

Scandium and alkali metal are unstable in atmosphere. Therefore, it is ideal to making to contain in another stable metal in small amount. Considering influence of oxidation and moisture, it is desirable to contain scandium and alkali metal in the metal having a work function greater than or equal to 4 eV. The metal having a work function greater than or equal to 4 eV, may be selected from the report of Michaelson: IBM, Journal of Research Development, Vol. 22, No. 1, 1978, pp 72. In viewpoint of ease of alloy formation with scandium and stability in layer formation, as the metal or alloy for forming the cathode of the present invention, the metal to be contained should be at least one element selected from the group consisting of silver, aluminum and indium.

When the cathode protection layer is provided above the cathode of the present invention, the desirable thickness of the cathode is greater than or equal to 1 nm and less than or equal to 30 nm. When the cathode is less than 1 nm, it becomes difficult to completely cover the organic thin film layer with the cathode component. For completely covering the organic thin film layer with the cathode component, 30 nm is sufficient. Unnecessarily thick cathode may make overall thickness of the diode thick.

Aluminum alloy is preferred to form the cathode protection layer over the cathode for low cost, corrosion resistance and workability. Additive material to be added to the aluminum is preferably selected among scandium, silicon, manganese and copper in view of ease of alloy formation and layer formation stability. In the organic thin film EL diode and a TFT drive matrix type organic thin film EL device, pure aluminum is insufficient in physical strength and may cause local unevenness or cracks, due to thermal expansion in driving the element, then causing breakage of film at the stage. On the other hand, by addition of additive material to aluminum, thermal expansion can be suppressed. Particularly, when luminance is high, local unevenness and crack can be significantly reduced. The additive element may provide definite effect at 0.1 to 5 mol % in the alloy forming the protection layer. When the additive element is less that 0.1 mol %, such small amount will never influence the various physical characteristics including thermal expansion coefficient in comparison with that of the pure aluminum. On the other hand, when the additive element exceeds 5 mol %, aluminum alloy may cause significant phase-separation to cause grain boundary in approximately 50% of the alloy surface to cause disturbance not only in the protection layer but also in the cathode layer and in the organic thin film layer. The cathode protection layer is desired to have a thickness in a range of 50 to 3000 nm for avoiding influence of oxygen and moisture.

The cathode and the cathode protection layer may be formed by vacuum deposition of a resistance heating type. Also, as disclosed in Japanese Unexamined Patent Publication No. Heisei 4-019993, it is possible to form the cathode and the cathode protection layer by sputtering the material to be deposited by inert gas ion to improve the adhesion thereof. According the layer formation method of the cathode and the cathode protection layer by sputtering of ion, because the ion has motion energy of several eV, surface migration is increased. Also, it becomes possible to attain high adhesion with the organic thin film surface and TFT surface. By selecting layer forming condition, it becomes possible to reduce physical or chemical damage for the organic thin film and to form the cathode and the cathode protection layer which are improved in adhesive property. Even when the mixture of metals which are mutually different in vapor pressure are used as target, variation of composition between the target and cathode, or target and cathode protection layer, is rarely found. Therefore, even when large size substrate is employed, the electrode may be formed uniformly and thus is practical.

It should be noted that, in order to protect the diode from oxygen and moisture, it is effective to provide a seal layer of metal oxide, metal sulfate or metal fluoride and so forth.

In the present invention, by applying the cathode and the cathode protection layer for the organic thin film EL diode, basic property of the element, such as charge injection characteristics, can be enhanced in comparison with the prior art. Also, in the organic thin film EL diode or the matrix type organic EL device, driving stability and physical strength can be improved while maintaining low power consumption. Therefore, it becomes possible to fabricate a fine matrix type organic EL device.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DETAILED DESCRIPTION OF THE PREFERRED EMBODIMENT

The preferred embodiments of the present invention will be discussed in detail. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.
Example 1

Figure 1:
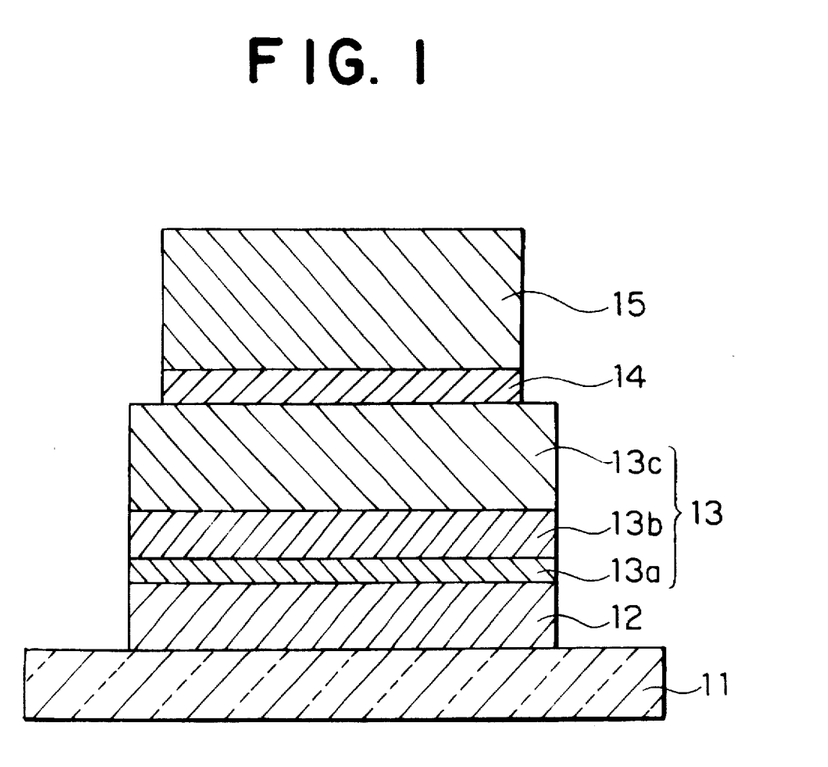
FIG. 1 is an explanatory illustration having an organic thin film EL diode having a cathode protection layer employed in Examples 1 to 6 of the present invention.

FIG. 1 is a section showing an EL diode according to Example 1 of the present invention. A fabrication process of the EL diode of the Example 1 will be discussed with reference to FIG. 1. On a glass substrate 11, ITO (indium-tin oxide) is formed by sputtering to have a sheet resistance of 15 $\Omega/\square$ to obtain an anode 12. Metal-free phthalocyanine refined by sublimation, as a hole injection layer 13a, is formed above ITO layer in a thickness of 10 nm by resistance heating type vacuum deposition. Next, a organic hole transportation layer 13b of polysilylene prepared by mixing 60 wt % of polymethyl phenyl silylene and 40 wt % of N,N,N',N'-tetraphenyl-4,4'-diaminobiphenyl, is formed in a thickness of 46 nm, by dip coating employing toluene. After sufficiently drying, an organic light emitting layer 13c is formed to contain 1.4 mol % of 3,9-Perylene-dicarboxylic acid diphenylester in the light emitting layer 13c by co-deposition of N-(2,4-xylyl)-4-aminonaphthalimide and 3,9-Perylene-dicarboxylic acid diphenylester from separate deposition source by molecular beam deposition method under a vacuum of $6\times10^{-10}$ Torr.

Next, as a cathode 14, aluminum alloy containing 1 mol % of scandium is evaporated by RF sputtering method under argon gas atmosphere and lithium is evaporated from resistance heating source to form the cathode containing 0.3 mol % of lithium in the thickness of 20 nm. Furthermore, as a protection layer 15 for the cathode, an aluminum alloy layer containing 1 mol % of scandium is formed in a thickness of 300 nm by RF sputtering under the presence of argon gas.

It should be noted that a work function of the cathode employed in the Example 1 as measured was approximately 3.1 eV as measured by a photo-electric emission method.

Figure 5:
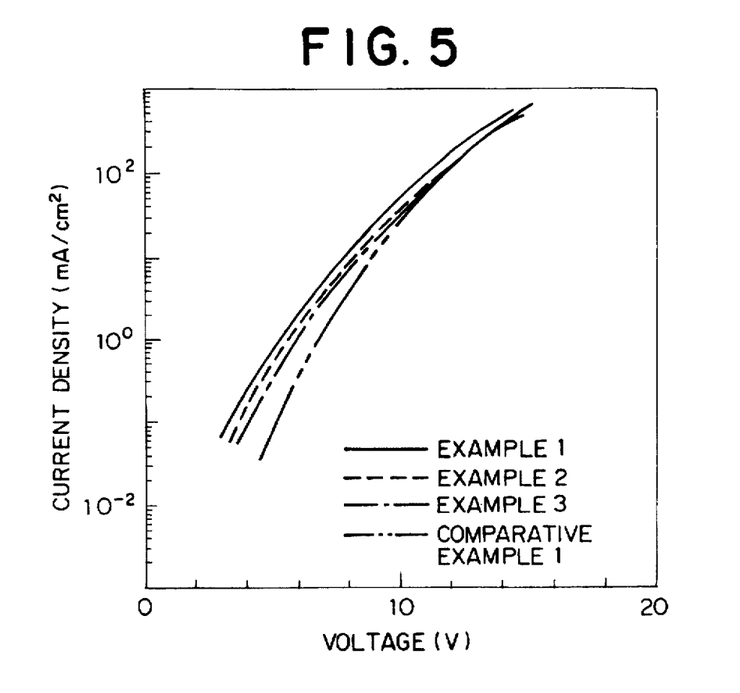
FIG. 5 is a graph showing a current density-voltage characteristics in the Examples 1 to 3 of the invention and Comparative Example 1.

Light emitting characteristics of this diode was measured in a dry air. As a result, as shown in FIG. 5, a current density-voltage characteristics of the Example 1 has a smaller voltage at the same current density in comparison with the later explained Comparative Example 1. This represents improvement of charge injection efficiency by employment of the cathode according to the invention.

Figure 7:
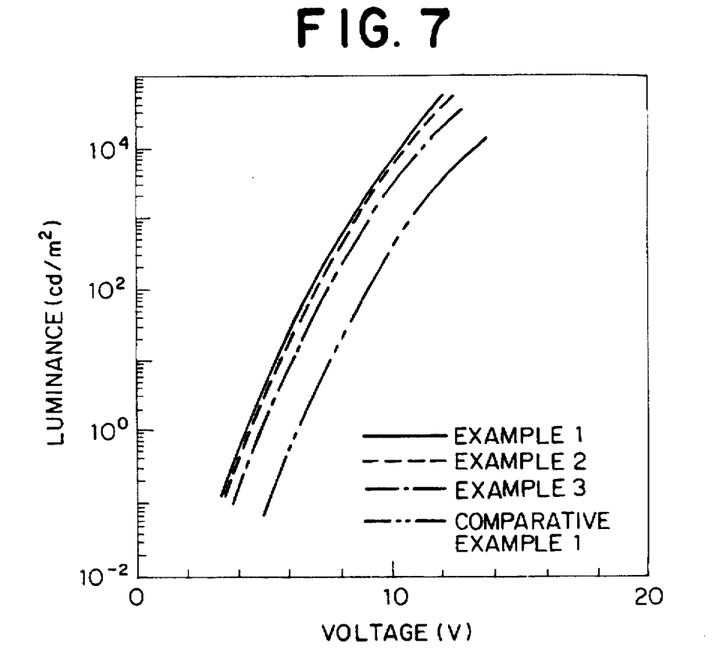
FIG. 7 is a graph showing a luminance-voltage characteristics of the Examples 1 to 3 of the invention and Comparative Example 1.

As shown in FIG. 7, a luminance-voltage characteristics in the Example 1 has a lower voltage at the same luminance in comparison with the Comparative Example 1. At a direct current voltage of 10V of charge voltage, a bright yellow illumination of 6300 cd/m$^2$ was attained. Also, after aging for 10 hours at a constant current density of 2 mA /cm$^2$, continuous light emission at constant current density of 4 mA/cm$^2$ was performed (at this time, voltage is 6.64V). After expiration of 500 hours, surface illumination condition has still been maintained, voltage was risen to 7.87V, and the luminance lowered from 105 cd/m$^2$ to 64 cd/m$^2$ This demonstrates improvement of driving stability by the effect of the cathode and cathode protection layer of the organic thin film EL diode according to the present invention, in comparison with the Comparative Example 1.

Example 2

Basically, the diode was fabricated substantially the same manner to the foregoing Example 1. However, the shown Example is differentiated from the Example 2 in the following points. As the cathode 14, aluminum alloy containing 1 mol % of scandium is evaporated by RF sputtering under the presence of argon gas and evaporation is controlled so that sodium is evaporated from alloy composed of sodium and indium through the resistance heating source so that 0.1 mol % of sodium may be contained in the cathode. The cathode is formed in a thickness of 20 nm. Also, as a protection layer 15 for the cathode, aluminum alloy containing 1 mol % of silicon is formed in a thickness of 450 nm by way of RF sputtering under the presence of argon gas. It should be noted that the work function of the cathode 14 employed in the Example 2 was approximately 3.0 eV as measured by the photo-electric emission method.

Light emitting characteristics of this diode was measured in a dry air. As a result, as shown in FIG. 5, a current-density-voltage characteristics of the Example 2 has a smaller voltage at the same current density in comparison with the later explained Comparative Example 1. This represents improvement of charge injection efficiency by employment of the cathode according to the invention.

As shown in FIG. 7, a luminance-voltage characteristics in the Example 2 has lower voltage at the same luminance in comparison with the Comparative Example 1. At a direct current voltage of 10V of charge voltage, a bright yellow illumination of 5100 cd/M$^2$ was attained. Also, after aging for 10 hours at a constant current density of 2 mA /cm$^2$, continuous light emission at constant current density of 4 mA/cm$^2$ was performed. At this time, voltage was 6.93V. After expiration of 500 hours, surface illumination condition has still been maintained, voltage was risen to 7.98V, and luminance lowered from 95 cd/M$^2$ to 56 cd/M$^2$. This demonstrates improvement of driving stability by the effect of the cathode and cathode protection layer of the organic thin film EL element according to the present invention, in comparison with the Comparative Example 1.

Example 3

Basically, the diode was fabricated substantially the same manner to the foregoing Example 1. However, the shown Example is differentiated from the Example 3 in the following points. As the cathode 14, silver alloy containing 1 mol % of scandium is evaporated by RF sputtering under the presence of argon gas and 0.3 mol % of lithium is contained in the cathode by the method of evaporating the lithium from the resistance heating source. The cathode is formed in a thickness of 20 nm. Also, as a protection layer 15 for the cathode 14, aluminum alloy containing 1 mol % of scandium is formed in a thickness of 300 nm by way of RF sputtering under the presence of argon gas. It should be noted that the work function of the cathode 14 employed in the Example 3 was approximately 3.1 eV as measured by the photo-electric emission method.

Light emitting characteristics of this diode was measured in a dry air. As a result, as shown in FIG. 5, a current density-voltage characteristics of the Example 3 has a smaller voltage at the same current density in comparison with the later explained Comparative Example 1. This represents improvement of charge injection efficiency by employment of the cathode according to the invention. As shown in FIG. 7, a luminance-voltage characteristics in the Example 3 has a lower voltage at the same luminance in comparison with the Comparative Example 1. At a direct current voltage of 10V of charge voltage, a bright yellow illumination of 2650 cd/m$^2$ was attained. Also, after aging for 10 hours at a constant current density of 2 mA /cm$^2$, continuous light emission at constant current density of 4 mA/cm$^2$ was performed. At this time, voltage was 7.25V. After expiration of 500 hours, surface illumination condition has still been maintained, voltage was risen to 8.31V, and luminance lowered from 81 cd/m$^2$ to 48 cd/m$^2$. This demonstrates improvement of driving stability by the effect of the cathode and cathode protection layer of the organic thin film EL diode according to the present invention, in comparison with the Comparative Example 1.

Example 4

Basically, the element was fabricated substantially the same manner to the foregoing Example 1. However, the shown Example is differentiated from the Example 4 in the following points. As the cathode 14, indium alloy containing 1 mol % of scandium is evaporated by RF sputtering under the presence of argon gas and 0.3 mol % of lithium is contained in the cathode by the method of evaporating the lithium from the resistance heating source. The cathode is formed in a thickness of 20 nm. Also, as a protection layer for the cathode, aluminum alloy containing 1 mol % of scandium is formed in a thickness of 300 nm by way of RF sputtering under the presence of argon gas. It should be noted that the work function of the cathode 14 employed in the Example 4 was approximately 3.1 eV as measured by the photo-electric emission method.

Figure 6:
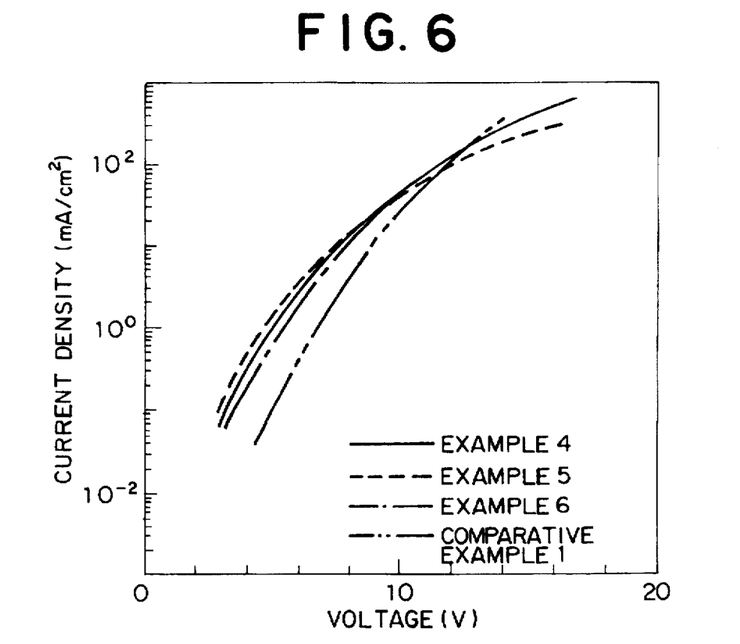
FIG. 6 is a graph showing a current density-voltage characteristics in the Examples 4 to 6 of the invention and Comparative Example 1.
Figure 8:
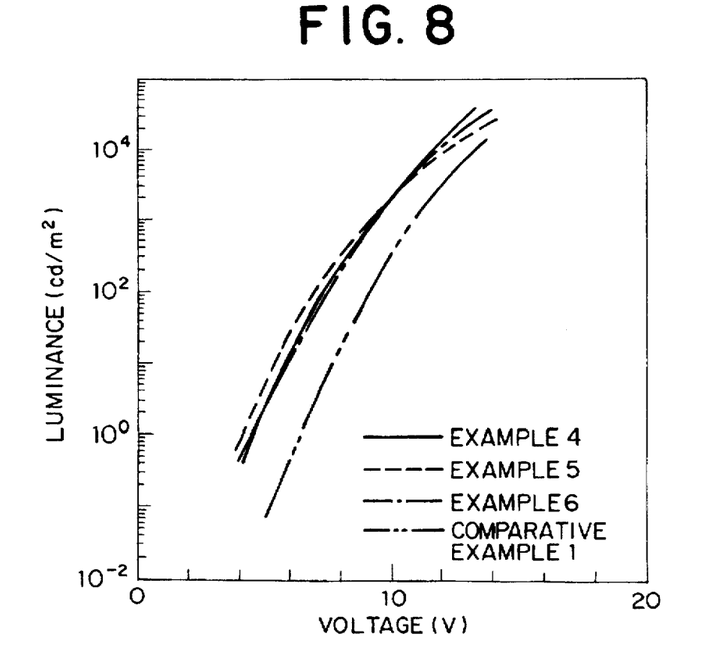
FIG. 8 is a graph showing a luminance-voltage characteristics of the Examples 4 to 6 of the invention and Comparative Example 1.
Figure 9:
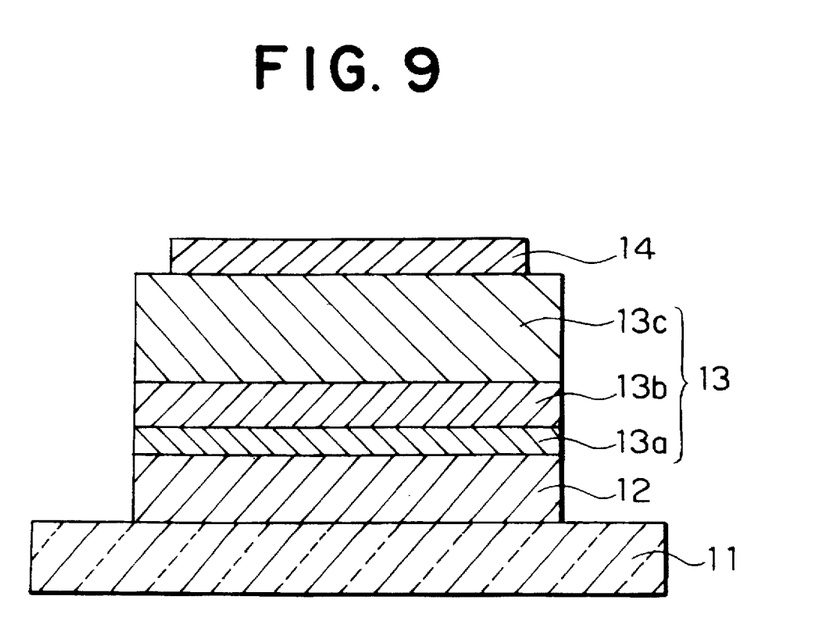
FIG. 9 is an explanatory illustration of an organic thin film EL diode having no cathode protection layer according to the Example 8 of the present invention.

Light emitting characteristics of this diode was measured in a dry air. As a result, as shown in FIG. 6, a current density-voltage characteristics of the Example 4 has a smaller voltage at the same current density in comparison with the later explained Comparative Example 1. This represents improvement of charge injection efficiency by employment of the cathode according to the invention. As shown in FIG. 8, a luminance-voltage characteristics in the Example 4 has a lower voltage at the same luminance in comparison with the Comparative Example 1. At a direct current voltage of 10V of charge voltage, a bright yellow illumination of 2100 cd/m$^2$ was attained. Also, after aging for 10 hours at a constant current density of 2 mA /cm$^2$, continuous light emission at constant current density of 4 mA/cm$^2$ was performed. At this time, voltage was 6.25V.

After expiration of 500 hours, surface illumination condition has still been maintained, voltage was risen to 6.98V, and luminance lowered from 51 cd/m² to 32 cd/m². This demonstrates improvement of driving stability by the effect of the cathode and cathode protection layer of the organic thin film EL diode according to the present invention, in comparison with the Comparative Example 1.

Example 5

As the cathode 14, aluminum alloy containing 1 mol % of scandium is evaporated by RF sputtering under the presence of argon gas and 0.3 mol % of lithium is contained in the cathode by the method of evaporating the lithium from the resistance heating source. The cathode is formed in a thickness of 20 nm. Also, as a protection layer 15 for the cathode, aluminum alloy containing 1 mol % of silicon and 1.5 mol % of copper is formed in a thickness of 450 nm by way of RF sputtering under the presence of argon gas. Except for those set forth above, the element was fabricated in the same manner to the foregoing Example 1. It should be noted that the work function of the cathode 14 employed in the Example 5 was approximately 3.0 eV as measured by the photo-electric emission method.

Light emitting characteristics of this diode was measured in a dry air. As a result, as shown in FIG. 6, a current density-voltage characteristics of the Example 5 has a smaller voltage at the same current density in comparison with the later explained Comparative Example 1. This represents improvement of charge injection efficiency by employment of the cathode according to the invention. As shown in FIG. 8, a luminance-voltage characteristics in the Example 5 has a lower voltage at the same luminance in comparison with the Comparative Example 1. At a direct current voltage of 10V of charge voltage, a bright yellow illumination of 1910 cd/m² was attained. Also, after aging for 10 hours at a constant current density of 2 mA /cm², continuous light emission at constant current density of 4 mA/cm² was performed. At this time, voltage was 6.2V. After expiration of 500 hours, surface illumination condition has still been maintained, voltage was risen to 6.94V, and luminance is lowered from 75 cd/m² to 42 cd/m². This demonstrates improvement of driving stability by the effect of the cathode and cathode protection layer of the organic thin film EL diode according to the present invention, in comparison with the Comparative Example 1.

Example 6

As the cathode 14, aluminum alloy containing 1 mol % of scandium is evaporated by RF sputtering under the presence of argon gas and evaporation is controlled so that sodium is evaporated from alloy composed of sodium and indium through the resistance heating source so that 0.1 mol % of sodium may be contained in the cathode. The cathode is formed in a thickness of 20 nm. Also, as a protection layer 15 for the cathode, aluminum alloy containing 1 mol % of manganese is formed in a thickness of 350 nm by way of RF sputtering under the presence of argon gas. Except for those set forth above, the diode was fabricated in the same manner to the foregoing Example 6. It should be noted that the work unction of the cathode 14 employed in the Example 6 was approximately 3.0 eV as measured by the photo-electric emission method.

Light emitting characteristics of this diode was measured in a dry air. As a result, as shown in FIG. 6, a current density-voltage characteristics of the Example 6 has a smaller voltage at the same current density in comparison with the later explained Comparative Example 1. This represents improvement of charge injection efficiency by employment of the cathode according to the invention. As shown in FIG. 8, a luminance-voltage characteristics in the Example 6 has a lower voltage at the same luminance in comparison with the Comparative Example 1. At a direct current voltage of 10V of charge voltage, a bright yellow illumination of 1920 cd/m² was attained. Also, after aging for 10 hours at a constant current density of 2 mA /cm², continuous light emission at constant current density of 4 mA/cm² was performed. At this time, voltage was 6.75V. After expiration of 500 hours, surface illumination condition has still been maintained, voltage was risen to 7.88V, and luminance is lowered from 42 cd/m² to 28 cd/m². This demonstrates improvement of driving stability by the effect of the cathode and cathode protection layer of the organic thin film EL diode according to the present invention, in comparison with the Comparative Example 1.

Example 7

Figure 2:
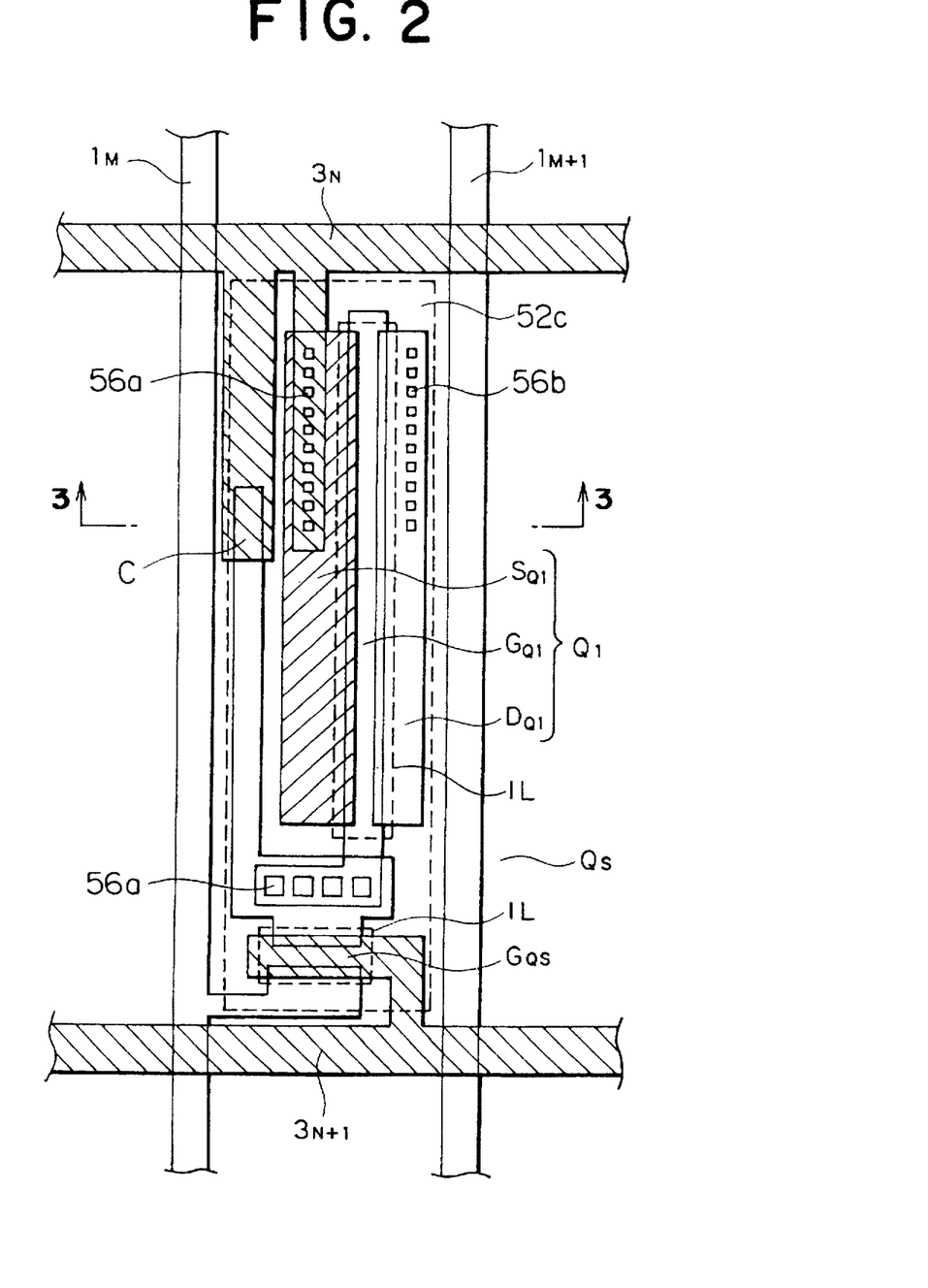
FIG. 2 is a plane view showing a layout of pixels forming a matrix type organic thin film EL device to be employed in Example 7 of the present invention.

FIGS. 2 and 3 are respectively plane and cross section views of Example 7 in the case where inverted stagger amorphous silicon (a-Si) TFT is applied to the organic thin film EL diode and a circuit for driving the organic thin film EL diode is formed on the glass substrate. FIG. 3 is a cross section taken along line 3—3 of FIG. 2. Hereinafter, fabrication process of Example 7 will be discussed with reference to FIGS. 2 and 3.

At first, Cr is grown on a glass substrate 50 in a thickness of 200 nm. By patterning the Cr layer, scanning electrode lines $3_N$ and $3_{N+1}$, an electrode line SL branched from the scanning electrode line, one side electrode E1 of a charge holding capacitor C, a gate electrode $G_{QS}$ of switching transistor and a gate electrode $G_{Q1}$ of a current control transistor are formed. Also, as a gate insulation layer 53a, $SiO_2$ is grown in a thickness of 400 nm. Thereafter, first contact holes 56a are formed through the insulation layer 53a.

Next, on the $SiO_2$ insulation layer 53a, an intrinsic amorphous silicon (i-a-Si) for forming island IL of TFT and an $n^+$ amorphous silicon ($n^+$-a-Si) for ohmic contact are grown respectively in thicknesses of 300 nm and 50 nm. Thereafter, the island IL is formed through patterning. The island IL is the portion where a channel portion of TFT (current control transistor $Q_1$, and switching transistor $Q_s$), are formed later.

Next, by depositing Cr in a thickness of 100 nm and performing patterning, signal line 1M, the source electrode $S_{Q1}$ of the current control transistor $Q_1$, drain electrode and source electrode of the switching transistor $Q_s$, and another electrode E2 of the charge holding capacitor C are formed. Also, with taking Cr layer for the source electrode and the drain electrode of each TFT, the i-a-Si and $n^+$-a-Si of the island IL of current controlling and switching TFTs are etched upon to the mid position of the i-a-Si to form channel portion in each TFT.

Next, a $SiO_2$ insulation layer 53b is formed in a thickness of 200 nm. Then, the insulation layer 53b is etched to form second contact holes 56b for connecting the drain electrode $D_{Q1}$ of the current control transistor $Q_1$ with a cathode (one electrode of the organic thin film EL diode) 55 which is formed in the later process.

Next, as a layer for a cathode protection layer 57, aluminum alloy containing 1 mol % of silicon and 1.5 mol % of copper is formed in a thickness of 300 nm by RF sputtering under the presence of argon gas. Thereafter, utilizing the layer for the cathode 55, aluminum alloy containing 1 mol % of scandium is evaporated by RF sputtering under the presence of argon gas, and 0.3 mol % of lithium is contained in the cathode by the method evaporating the lithium from the resistance heating source to form in to a 30 nm of layer. The layer for the cathode 55 and the layer for the cathode protection layer 57 are patterned by lift-off method to form the cathode 55 and the cathode protection layer 57 of the organic thin film EL diode.

Thus, a panel of 400×640 pixels, in which each individual pixel is 100×300 µm$^2$, is formed.

Next, on the panel thus formed, an organic thin film layer 52 is formed. The organic thin film layer 52 of the organic thin film EL element to be employed in the shown embodiment has a three layer structure of a spacer layer 52c, an organic light emitting layer 52b and a hole injection layer 52a are stacked in the order from the cathode side. In concrete, as the spacer layer 52c, N-(2,4-xylyl)-4-aminonaphtal imide is formed in a thickness of 50 nm by vacuum deposition. Thereafter, as the organic light emitting layer 52b, a light emitting layer containing 1.4 mol % of 3,9-Perylene-dicarboxylic acid diphenylester is formed in a thickness of 70 nm by co-deposition method from separate deposition sources of N-(2,4-xylyl)-4-aminonaphtal imide and 3,9-Perylene-dicarboxylic acid diphenylester.

Furthermore, as the hole injection layer 52a,N,N'-diphenyl-N,N'-di(3-methylphenyl)1,1'-biphenyl-4,4'-diamine is formed in a thickness of 50 nm. Finally, as an anode, ITO is formed in a thickness of 1 µm to complete fabrication of the TFT drive matrix type organic thin film EL device including the cathode 55 and the cathode protection layer 57.

Figure 4:
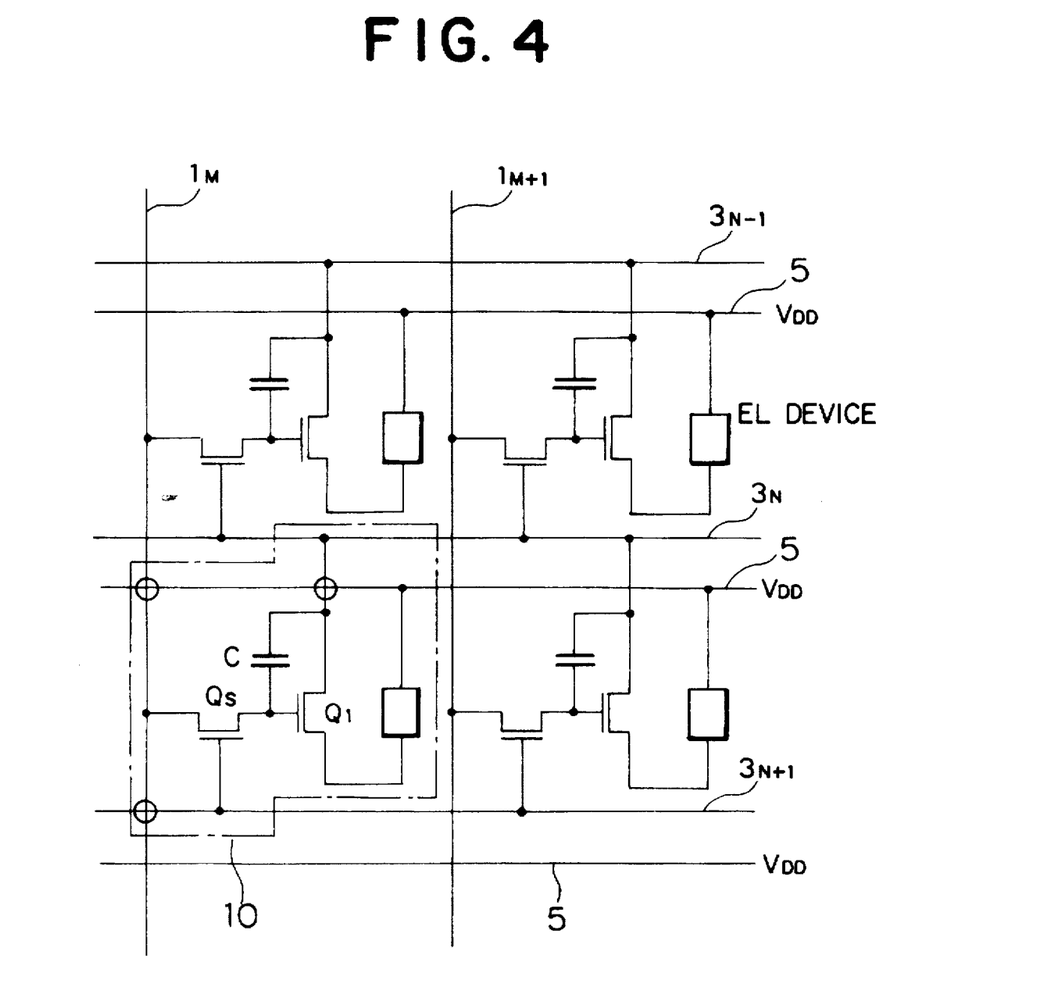
FIG. 4 is a circuit diagram for driving a matrix type organic thin film EL device employed in the Example 7 of the present invention.

Next, the operation of the above-mentioned matrix type organic thin film EL device will be discussed with reference to FIG. 4. In FIG. 4, it is assumed that the scanning electrode line $3_{N+1}$ is selected. Then, the switching transistor $Q_s$ turns ON. Thus, the voltage of the Mth signal electrode line $1_M$ is supplied to the charge holding capacitor C via the switching transistor $Q_s$. When the canning electrode line $3_{N+1}$ becomes in a non-selected state, he switching transistor $Q_s$ turns OFF. Thus, the voltage of he signal line $1_M$ is maintained in the charge holding capacitor C. The terminal voltage of the capacitor C is charged between the gate and source of the current controlling transistor $Q_1$. Then, a current corresponding to the gate voltage and drain current characteristics of the transistor $Q_1$ flows through the power source electrode 5→ organic thin film EL diode→ transistor $Q_1$→ scanning electrode line $3_N$. Therefore, the organic thin film EL diode illuminates. At this time, if a relationship between the luminance of the organic thin film EL diode and the voltage to be applied to the capacitor C is known, it becomes possible to illuminate the organic thin film EL diode at a predetermined luminance.

In the shown Example, when the organic thin film EL element was driven at 7V of terminal voltage, approximately 420 cd/m$^2$ of luminance is attained. At this time, ratio of pixel defective portion was approximately 7% with respect to the overall pixels. This is much smaller than the case where the cathode is prepared according to a Comparative Example 2. Also, power consumption of the organic thin film EL diode in the panel was less than or equal to 1.4 W, which is approximately half of that of the Comparative Example 2.

It should be noted that, in the shown Example 7, the organic thin film EL diode is fabricated by forming a cathode protection layer 57, a cathode 55, a spacer layer 52c, an organic light emitting layer 52b, a hole injection layer 52a and anode 54 on the TFT in order for emitting light through the anode 54. However, it is also possible to form the anode 54, the hole injection layer 52a, the organic light emitting layer 52b, the spacer layer 52c and the cathodes 55 in order for emitting light through a glass substrate 50 of the TFT.

Example 8

Basically, the substrate and the organic thin film layer are substantially the same as the foregoing Example 1 shown in FIG. 1. However, the shown Example is differentiated from the Example 1 in the following points. As the cathode 14, aluminum alloy containing 1 mol % of scandium is evaporated by RF sputtering under the presence of argon gas and 0.3 mol % of lithium is contained in the cathode by the method of evaporating the lithium from the resistance heating source. The cathode is formed in a thickness of 120 nm. It should be noted that the cathode protection layer 15 was not formed. It should be further noted that the work function of the cathode 14 employed in the Example 8 was approximately 3.1 eV as measured by the photo-electric emission method.

Figure 10:
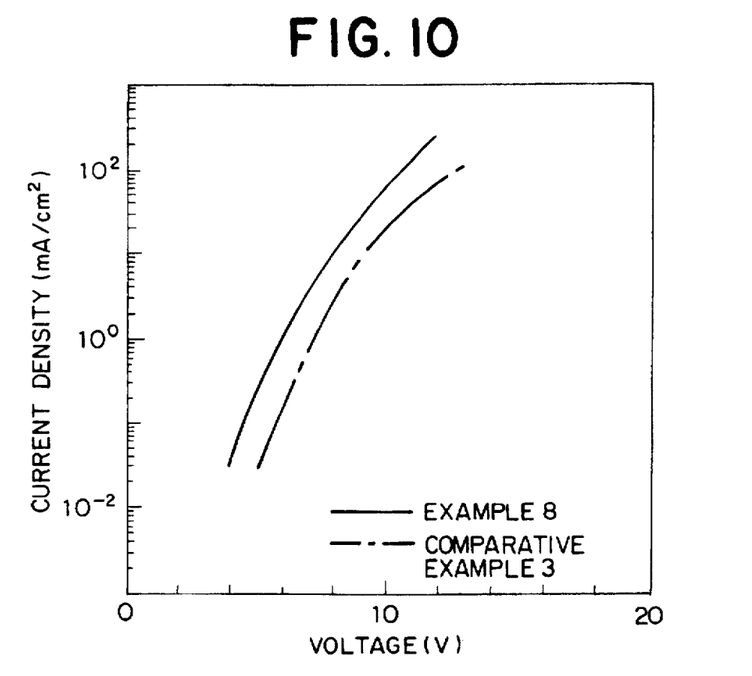
FIG. 10 is a graph showing a current density-voltage characteristics of Example 8 of the invention and Comparative Example 3.

Light emitting characteristics of this diode was measured in the dry air. As shown in FIG. 10, it is found from the comparison of the resulted data at the same current density that the voltage of the shown example 8 is low relative to that of a following comparative example 3. This indicates that the injection efficiency of the carrier is improved by the cathode of the present invention.

Figure 11:
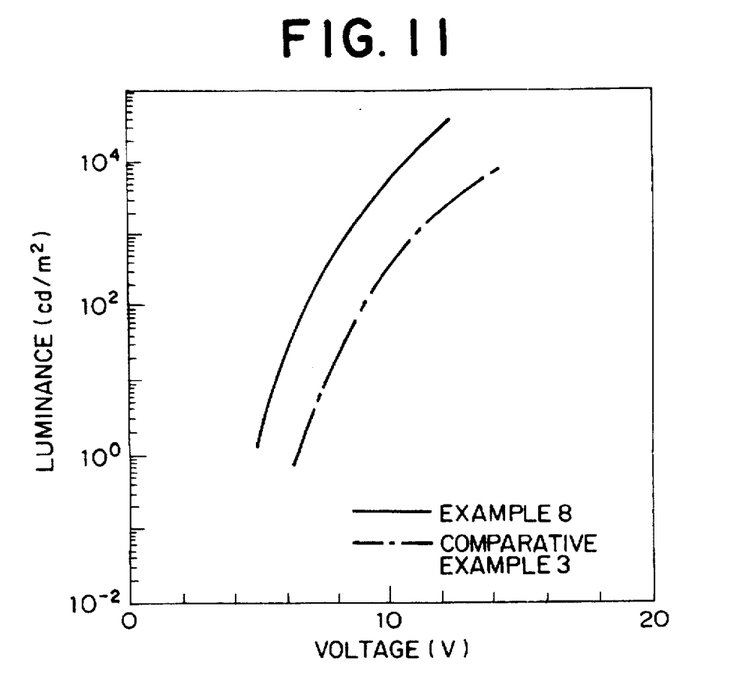
FIG. 11 is a graph showing a luminance-voltage characteristics of Example 8 of the invention and Comparative Example 3.

As shown in FIG. 11, a luminance-voltage characteristics in the Example 8 has a lower voltage at the same luminance in comparison with the Comparative Example 3. At a direct current voltage of 10V of charge voltage, a bright yellow illumination of 5940 cd/m$^2$ was attained. Also, after aging for 10 hours at a constant current density of 2 mA /cm$^2$, continuous light emission at constant current density of 4 mA/cm$^2$ was performed. At this time, voltage was 6.68V. After expiration of 500 hours, surface illumination condition has still been maintained, voltage was risen to 7.98V, and luminance lowered from 102 cd/m$^2$ to 58 cd/m$^2$. This demonstrates improvement of driving stability by the effect of the cathode of the organic thin film EL diode according to the present invention, in comparison with the Comparative Example 3.

Comparative Example 1

As shown in FIG. 1, on a glass substrate 11, ITO was formed by sputtering to have a sheet resistance of 15 Ω/□ to obtain an anode 12. Metal-free phthalocyanine refined by sublimation, as a hole injection layer 13a, was formed above ITO layer in a thickness of 10 nm by resistance heating type vacuum deposition. Next, a organic hole transportation layer 13b of polysilylene prepared by mixing 60 wt % of polymethy phenyl silylene and 40 wt % of N,N,N', N''-tetraphenyl-4,4'-diaminobiphenyl, was formed in a thickness of 46 nm, by dip coating employing toluene.

After sufficiently drying, an organic light emitting layer 13c was formed to contain 1.4 mol % of 3,9-Perylene-dicarboxylic acid diphenylester in the light emitting layer 13c by co-deposition of N-(2,4-xylyl)-4-aminonaphthalimide and 3,9-Perylene-dicarboxylic acid diphenylester from separate deposition source by molecular beam deposition method under a vacuum of 6×10$^{-10}$ Torr, in a thickness of 70 nm.

Next, as a cathode 14, aluminum alloy containing 0.3 mol % of lithium in the thickness of 20 nm is formed by co-deposition. Furthermore, as a protection layer 15 for the cathode, an aluminum layer is formed in a thickness of 80 nm by deposition of resistance heating. Thus, organic thin film EL diode of the comparative example 1 was completed.

Light emitting characteristics of this element was measured in the air. At a direct current voltage of 10V of charge voltage, a yellow illumination of 380 cd/m² was attained. Also, after aging for 10 hours at a constant current density of 2 mA/cm², continuous light emission at constant current density of 4 mA/cm² was performed. At this time, voltage is 7.98V. After expiration of 500 hours, a surface illumination condition is not maintained any more and 40% of overall pixels of the diode had disappeared. Also, voltage was risen to 13.4V, and luminance lowered from 24 cd/m² to 8 cd/m².

Comparative Example 2

This example is basically the same as the Example 2 but different in the following points. Namely, as the protection layer 15 for the cathode, aluminum layer is formed by deposition method of the resistance heating in a thickness of 300 nm. Also, as the cathode 14, lithium is co-deposited with aluminum so that lithium is contained in the content of 2 mol % in the cathode, in the thickness of 20 nm. The construction other than those set forth above is similar to the Example 2. Thus, TFT drive matrix type organic EL element is formed.

In the comparative example 2, when the organic thin film EL element is driven by the terminal voltage of 7V, approximately 100 cd/m² of luminance was obtained. At this time, the ratio of pixel defect portion was about 15% in relation to the overall pixels. Also, the power consumption of the organic thin film EL diode portion in the panel was 2.7 w.

Comparative Example 3

This example is basically the same as the Example 8 but different in the following points. Namely, as the cathode 14, a layer of aluminum alloy containing 0.3 mol % of lithium is formed by deposition method of the resistance heating in a thickness of 120 nm. The construction other than those set forth above is similar to the Example 8.

Light emitting characteristics of this diode was measured in the air. At a direct current voltage of 10V of charge voltage, a yellow illumination of 358 cd/m² was attained. Also, after aging for 10 hours at a constant current density of 2 mA/cm², continuous light emission at constant current density of 4 mA/cm² was performed. At this time, voltage is 8.18V. After expiration of 350 hours, voltage was risen to 15.3V, and luminance is lowered from 20 cd/m² to 3 cd/M². After expiration of 420 hours, the light emission completely disappeared Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within the scope encompassed and equivalents thereof with respect to the feature set out in the appended claims.

What is claimed is:

1. An organic thin film electroluminescent diode comprising:

an anode;

a cathode including a metal or alloy, the metal or alloy having a work function greater than or equal to 4 eV, the cathode further including 0.01 to 5 mol % of scandium and 0.01 to 0.3 mol % of alkali metal; and an organic thin film layer disposed between said anode and cathode and having at least one light emitting layer.

2. An organic thin film electroluminescent diode as set forth in claim 1, wherein the thickness of said cathode is in a range of 1 to 30 nm, and said organic thin film electroluminescent diode includes a cathode protection layer in a thickness of 50 to 3000 nm formed on said cathode.

3. An organic thin film electroluminescent diode as set forth in claim 2, wherein said cathode protection layer is formed of an aluminum alloy containing at least one element selected from a group consisting of scandium, silicon, manganese, and copper, in a content of 0.1 to 5 mol %.

4. An organic thin film electroluminescent diode as set forth in claim 1, wherein a work function of said cathode is less than 4 eV, due to the scandium and the alkali metal being included in said cathode.

5. An organic thin film electroluminescent diode as set forth in claim 4, wherein the metal or alloy having the work function of greater than or equal to 4 eV is aluminum.

6. An organic thin film electroluminescent diode as set forth in claim 1, wherein the organic thin film electroluminescent diode includes a cathode protection layer in a thickness of 50 to 3000 nm formed on said cathode.

7. An organic thin film electroluminescent diode, comprising:

an anode;

a cathode formed of a metal or alloy containing 0.01 to 5 mol % of scandium and 0.01 to 0.3 mol % of alkali metal; and an organic thin film layer disposed between said anode and cathode and having at least one light emitting layer, wherein said cathode is formed of a material selected from a group consisting of silver, aluminum, indium, and an alloy thereof, the material containing said scandium and alkali metal.

* * * * *